(12) United States Patent
Kim et al.

(10) Patent No.: US 8,088,653 B2
(45) Date of Patent: Jan. 3, 2012

(54) THIN-FILM TRANSISTOR, METHOD OF MANUFACTURING THE SAME, LIQUID CRYSTAL DISPLAY PANEL HAVING THE SAME AND ELECTRO-LUMINESCENCE DISPLAY PANEL HAVING THE SAME

(75) Inventors: Byoung-June Kim, Seongnam-si (KR); Sung-Hoon Yang, Seoul (KR); Min-Seok Oh, Yongin-si (KR); Jae-Ho Choi, Seoul (KR); Yong-Mo Choi, Cheongju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/604,318

(22) Filed: Oct. 22, 2009

(65) Prior Publication Data

US 2010/0062574 A1 Mar. 11, 2010

Related U.S. Application Data

(62) Division of application No. 11/538,394, filed on Oct. 3, 2006, now Pat. No. 7,615,867.

(30) Foreign Application Priority Data

Oct. 28, 2005 (KR) ................. 2005-102429

(51) Int. Cl.
*H01L 21/00* (2006.01)
(52) U.S. Cl. .. 438/151; 438/158; 438/159; 257/E21.414
(58) Field of Classification Search ................. 438/158, 438/159, 149, 151, 30; 257/E21.414
See application file for complete search history.

(56) References Cited

U.S. PATENT DOCUMENTS

| | | | |
|---|---|---|---|
| 5,942,767 A * | 8/1999 | Na et al. ........................ 257/59 |
| 6,255,706 B1 | 7/2001 | Watanabe et al. |
| 6,747,288 B2 * | 6/2004 | Yamazaki et al. .............. 257/57 |
| 2005/0014319 A1 * | 1/2005 | Yamazaki et al. ............ 438/197 |
| 2005/0161740 A1 | 7/2005 | Park et al. |
| 2006/0076562 A1 | 4/2006 | Lee et al. |

* cited by examiner

*Primary Examiner* — Michael Trinh
(74) *Attorney, Agent, or Firm* — Innovation Counsel LLP

(57) ABSTRACT

A TFT includes a gate electrode, an active layer, a source electrode, a drain electrode, and a buffer layer. The gate electrode is formed on the substrate; the active layer is formed on the gate electrode. The source and drain electrodes, formed on the active layer, are separated by a predetermined distance. The buffer layer is formed between the active layer and the source and drain electrodes. The buffer layer has a substantially continuously varying content ratio corresponding to a buffer layer thickness. The buffer layer is formed to suppress oxidation of the active layer, and reduce contact resistance.

23 Claims, 13 Drawing Sheets

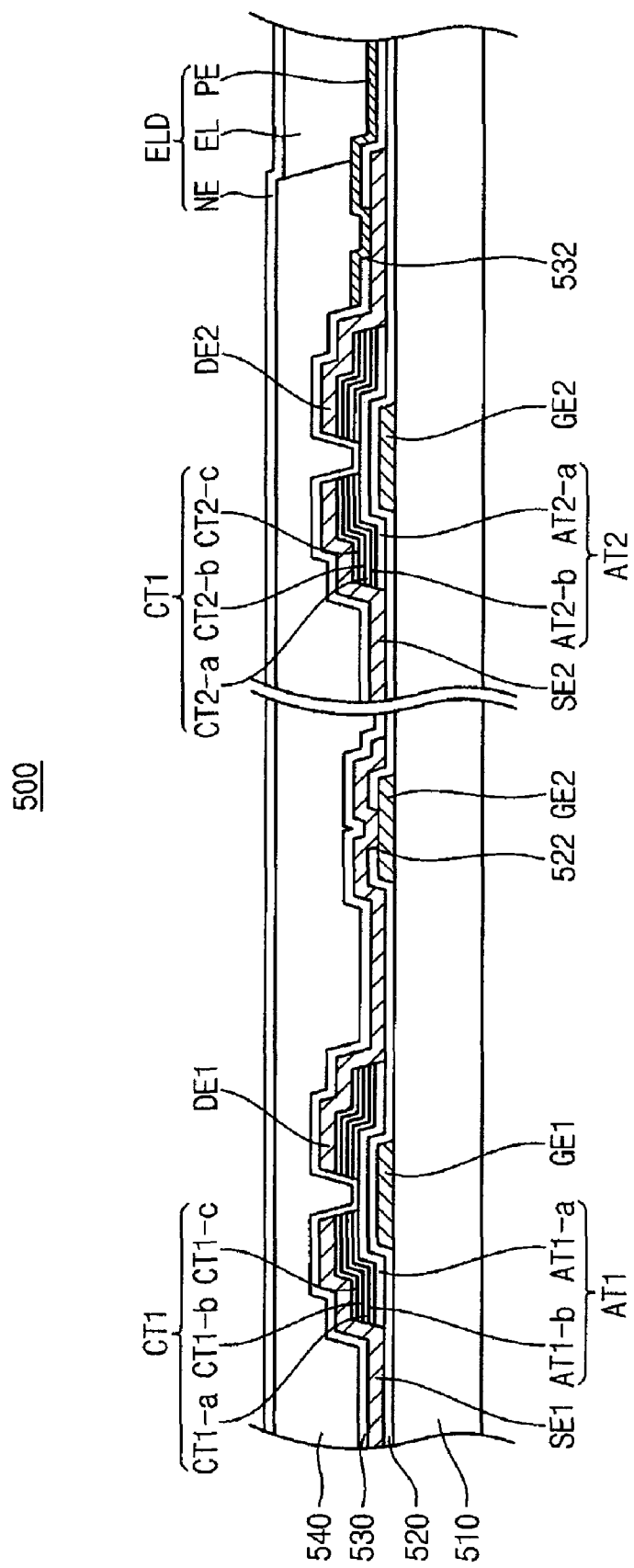

THIN-FILM TRANSISTOR, METHOD OF MANUFACTURING THE SAME, LIQUID CRYSTAL DISPLAY PANEL HAVING THE SAME AND ELECTRO-LUMINESCENCE DISPLAY PANEL HAVING THE SAME

CROSS-REFERENCE TO RELATED APPLICATIONS

This application is a divisional application of U.S. patent application Ser. No. 11/538,394 filed on Oct. 3, 2006 which claims priority under 35 U.S.C. §119 to Korean Patent Application No. 2005-0102429 filed on Oct. 28, 2005, the contents of which are herein incorporated by reference in their entirety.

BACKGROUND OF THE INVENTION

1. Field of the Invention

The present invention relates to a thin-film transistor, a method of manufacturing the thin-film transistor, a liquid crystal display panel having the thin-film transistor, and an electro-luminescence display panel having the thin-film transistor. More particularly, the present invention relate to a TFT having improved electrical characteristics, a method of manufacturing the thin-film transistor, a liquid crystal display panel having the thin-film transistor, and an electro-luminescence display panel having the thin-film transistor.

2. Description of the Related Art

In general, a flat display device can be a liquid crystal display device, a plasma display panel device, a field emission display device, an electro-luminescence display device, etc. Typically, the liquid crystal display device and the electro-luminescence display device employ a plurality of thin-film transistors fabricated by forming a thin film on a transparent substrate. TFT Each thin film transistor includes a gate electrode, a source electrode, a drain electrode, a semiconductor layer, and an impurity layer. The gate electrode is formed on the transparent substrate. The source electrode and the drain electrode are formed over the gate electrode, separated from each other. The semiconductor layer is formed between the gate electrode and the source electrode, and between the gate electrode and the drain electrode. The impurity layer is formed between a portion of the semiconductor layer and the source electrode, and between a portion of the semiconductor layer and the drain electrode, respectively. The semiconductor layer may include amorphous silicon and the impurity layer may include amorphous silicon highly doped with ions.

A method of manufacturing the TFT is briefly illustrated as follows. The gate electrode is formed on the transparent substrate. The semiconductor layer and the impurity layer are formed over the gate electrode. Next, the source electrode and the drain electrode are formed on the impurity layer, and are separated from each other. Here, a little blank time (vacuum break) generally exists between a formation of the impurity layer and a formation of the source electrode and the drain electrode.

During fabrication, native oxidation of silicon may occur on an upper face of the impurity layer between the formation of the source electrode and the drain electrode, and the formation of the impurity layer. The native silicon oxide layer formed on the impurity layer increases a contact resistance between the impurity layer and the source electrode, and between the impurity layer and the drain electrode. The increase in the contact resistance is undesirable because it deteriorates electric characteristics of the thin-film transistor.

SUMMARY OF THE INVENTION

Exemplary embodiments of the present invention provide a TFT that has enhanced electrical characteristics by suppressing a native oxidation.

Exemplary embodiments of the present invention provide a method of manufacturing the above-mentioned thin-film transistor.

Exemplary embodiments of the present invention provide a liquid crystal display panel with the above-mentioned thin-film transistor.

Exemplary embodiments of the present invention provide an electro-luminescence display panel with the above-mentioned thin-film transistor.

A TFT is provided according to one aspect of the present invention. The TFT may include a base substrate, a gate electrode, an active layer, a source electrode, a drain electrode, and a buffer layer. The gate electrode is formed on the base substrate. The active layer is formed on the gate electrode to cover the gate electrode. The source electrode and the drain electrode are formed on the active layer, and are spaced apart. The buffer layer is formed between the active layer and the source electrode, and between the active layer and the drain electrode. The buffer layer suppresses an oxidation of the active layer.

In an exemplary embodiment of the present invention, the buffer layer may have a plurality of layers, which may include a second material that is bonded to form a compound with a first material in the active layer. The second material may have a layer content ratio that changes substantially continuously, corresponding to a thickness of the buffer layer.

According to another aspect of the present invention, there is provided a method of manufacturing a thin-film transistor. In the method of manufacturing the thin-film transistor, a gate electrode is formed on a base substrate. A gate insulation layer is formed on the substrate to cover the gate electrode. An active layer is formed on the gate insulation layer to cover the gate electrode. A buffer layer is formed on the active layer to suppress an oxidation of the active layer. First predefined portions of the buffer layer and the active layer are partially primarily etched. A source electrode and a drain electrode are formed on the primarily etched active layer, separated from each other by a predetermined distance. Second predefined portions of the buffer layer and the active layer are partially etched secondarily using the source electrode and the drain electrode as an etching mask.

According to another aspect of the present invention, there is provided a liquid crystal display panel. The liquid crystal display panel may include a first substrate, a second substrate, and a liquid crystal layer. A TFT is formed on the first substrate. The second substrate is disposed to face the first substrate. The liquid crystal layer is interposed between the first substrate and the second substrate.

The TFT includes a gate electrode, an active layer, a source electrode, a drain electrode, and a buffer layer. The gate electrode is formed on the first substrate. The active layer is formed on the gate electrode to cover the gate electrode. The source electrode and the drain electrode are formed on the active layer, and separated by a predetermined distance. The buffer layer is formed between the active layer and the source electrode, and between the active layer and the drain electrode to suppress an oxidation of the active layer.

According to still another aspect of the present invention, there is provided an electro-luminescence display panel. The electro-luminescence display panel includes a base substrate, a switching thin-film transistor, a driving TFT, and an electro-luminescence device (ELD). The switching TFT is formed on the base substrate. The driving TFT is formed on the base substrate and is electrically connected to the switching thin-film transistor. The electro-luminescence device (ELD) is connected to the driving thin-film transistor, and generates a light.

The driving TFT includes a driving gate electrode, a driving active layer, a driving source electrode, and a driving drain electrode, and a driving buffer layer. The driving gate electrode is formed on the base substrate. The driving active layer is formed over the driving gate electrode to cover the driving gate electrode. The driving source electrode and the driving drain electrode are formed on the driving active layer, and separated by a predetermined distance. The driving buffer layer is formed between the driving active layer and the driving source electrode, and between the driving active layer and the driving drain electrode. The driving buffer layer is formed to suppress an oxidation of the driving active layer.

In an exemplary embodiment of the present invention, the switching TFT may include a switching gate electrode, a switching active layer, a switching source electrode, and a switching drain electrode. The switching gate electrode is formed on the base substrate. The switching active layer is formed on the switching gate electrode to cover the switching gate electrode. The switching source electrode and the switching drain electrode are formed on the switching active layer, and separated from each other by a predetermined distance. The driving buffer layer is formed between the switching active layer and the switching source electrode to suppress an oxidation of the switching active layer. The buffer layer is formed between the active layer and the source electrode, and between the active layer and the drain electrode, to suppress an oxidation of the active layer. Thus, an increase in a contact resistance between the source electrode and the drain electrode due to the oxidation may be suppressed, so that the thin film transistor may have improved electrical characteristics.

BRIEF DESCRIPTION OF THE DRAWINGS

The above and other features and advantages of the present invention will become more apparent by describing in detailed exemplary embodiments thereof with reference to the accompanying drawings, in which:

FIG. 8 is a cross-sectional view taken along a line II-IF in FIG. 7.

DESCRIPTION OF THE EMBODIMENTS

Figure 1:
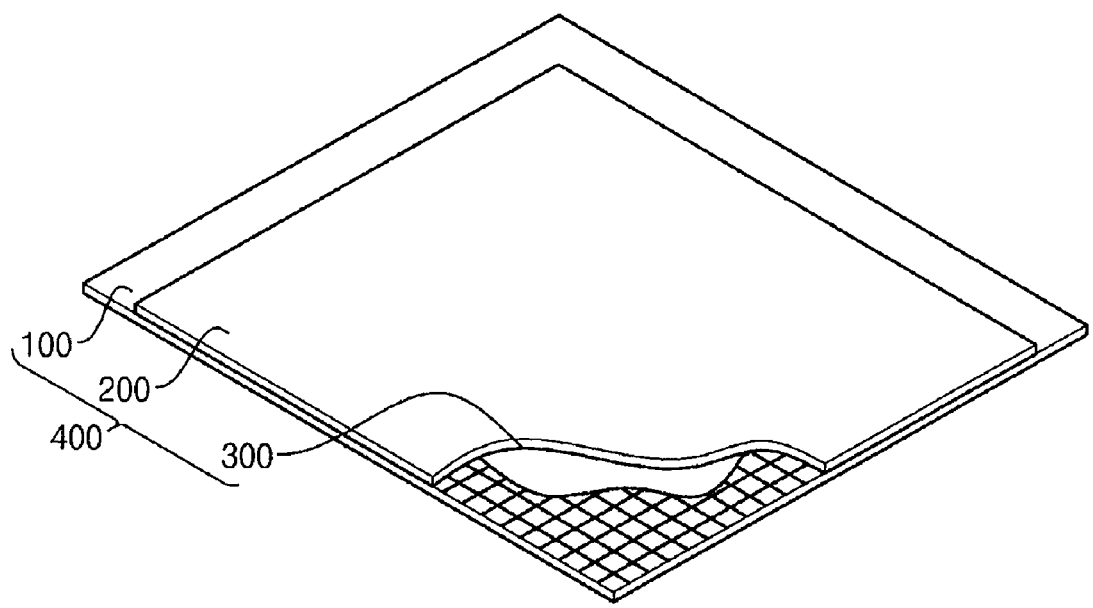
FIG. 1 is a perspective view illustrating a liquid crystal display panel in accordance with an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Like reference numerals refer to like elements throughout. As used herein, the term "and/or" includes any and all combinations of one or more of the associated listed items.

It will be understood that, although the terms first, second, third etc., may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary Embodiments of Liquid Crystal Display (LCD) Panel

FIG. 1 is a perspective view illustrating a liquid crystal display (LCD) panel in accordance with an exemplary embodiment of the present invention.

Referring to FIG. 1, a LCD panel 400 includes a first substrate 100, a second substrate 200, and a liquid crystal layer 300. The liquid crystal display panel 400 displays an image using a light. The first substrate 100 includes plural pixel electrodes connected with a matrix of thin-film transistors. A thin-film transistor applies a driving voltage to each pixel electrode, with signal lines operating each thin-film transistor.

The second substrate 200 is disposed to face the first substrate 100. The second substrate 200 includes a transparent conductive common electrode disposed at a front face of the first substrate 100, and color filters disposed in a region that faces the pixel electrodes.

Typically, white light is applied to color filters, which selectively transmit light corresponding to the respective filter color. For example, a red color filter selectively transmits a red light, a green color filter selectively transmits a green light, and a blue color filter selectively transmits a blue light.

The liquid crystal layer 300 is interposed between the first substrate 100 and the second substrate 200. The liquid crystals in liquid crystal layer 300 are rearranged by an electric field formed between the pixel electrode and the common electrode. The rearranged liquid crystal layer 300 controls transmissivity of a light, which may be provided from an external light source. Thereafter, the controlled light passes through the color filters to display an image.

Figure 2:
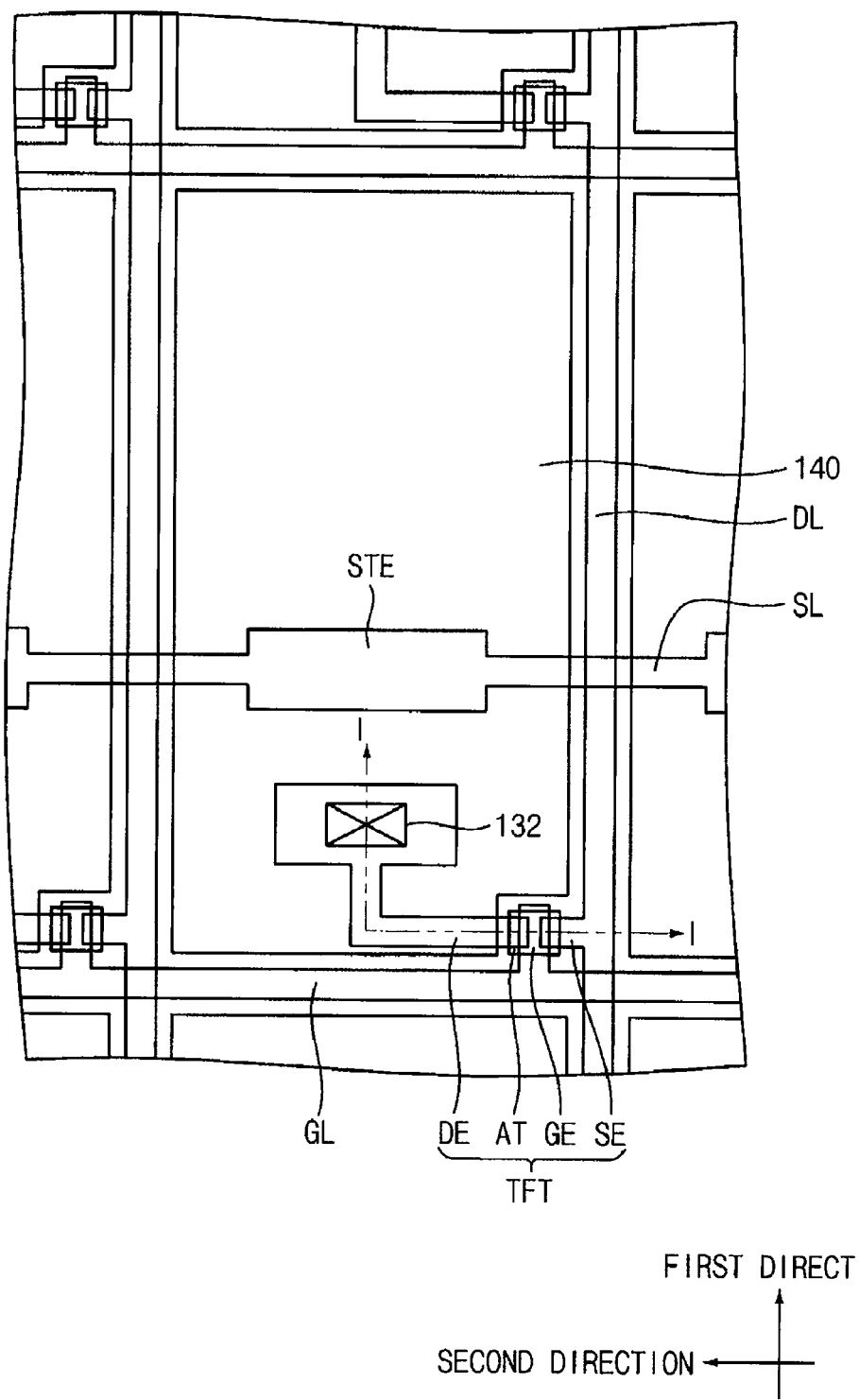
FIG. 2 is a plane view conceptually illustrating a unit pixel of a first substrate in FIG. 1.
Figure 3:
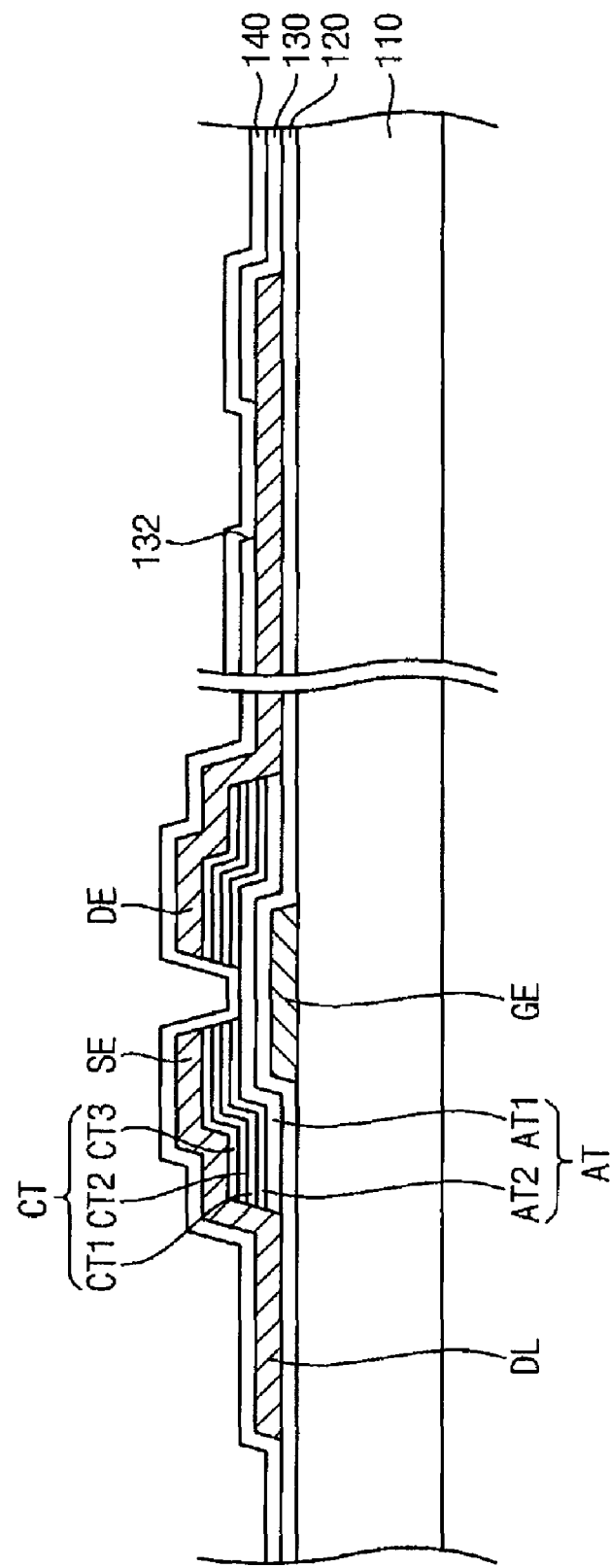
FIG. 3 is a cross-sectional view taken along a line I-I' in FIG. 2.

FIG. 2 is a plane view conceptually illustrating a unit pixel of the first substrate in a display panel of FIG. 1. FIG. 3 is a cross-sectional view taken along a line I-I' in FIG. 2.

Referring to FIGS. 2 and 3, the first substrate 100 includes a data line DL, a gate line GL, a pixel electrode 140, a TFT, and a storage line SL. The data line DL is formed to extend in a first direction and a plurality of the data lines DL is formed substantially in parallel with a first direction. The data DL is electrically connected to the TFT to apply a data signal to the TFT. The gate line GL extends in the second direction to cross the data line. A plurality of the gate lines is formed substantially in parallel with the second direction. For example, the first direction is substantially perpendicular to the second direction. As the data line DL and the gate line GL are formed to cross each other, a plurality of unit pixels is defined. The pixel electrode 140 and the TFT are formed in each unit pixel.

The pixel electrode 140 is formed in the unit pixel. The pixel electrode includes a transparent conductive material. The pixel electrode 140 is electrically connected to the TFT through a contact hole 132. The pixel electrode is charged by the driving voltage applied from the thin-film transistor. The pixel electrode 140 may be formed by patterning the transparent conductive material such as indium tin oxide (ITO), indium zinc oxide (IZO), amorphous indium tin oxide (a-ITO), etc., by a photo process and an etching process.

The TFT includes a gate electrode GE, a source electrode SE, a drain electrode DE, an active layer AT, and a buffer layer CT. The gate electrode GE is formed to extend from the gate line GL along the first direction. The source electrode SE is formed to extend from the data line along the second direction, to be partially overlapped with the gate electrode GE. The drain electrode DE is formed to face the source electrode SE, apart from the source electrode SE by a predetermined distance and overlapped with a portion of the gate electrode GE. For example, the drain electrode DE is formed to extend along the first direction and the second direction. Here, the drain electrode DE is electrically connected to the pixel electrode 140 through a contact hole 132.

The active layer AT is formed between the source electrode SE and the drain electrode DE, to cover the gate electrode GE. The buffer layer is formed between a portion of the active layer AT and the source electrode SE, and between a portion of the active layer AT and the drain electrode DE. The buffer layer suppresses increases of contact resistances between the active layer AT and the source electrode SE, and between the active layer AT and the drain electrode DE. The storage line SL is formed under the pixel electrode 140 in parallel with the gate line GL. The storage line SL includes a storage electrode STE formed in the unit pixel. The storage line SL applies a ground voltage provided from the outside to the storage electrode STE. A storage capacitor is formed from the pixel electrode 140, by separating the storage electrode STE from the pixel electrode, by a predetermined distance. The storage capacitor maintains the driving voltage charged in the pixel electrode 140.

Referring again to FIGS. 2 and 3, the first substrate 100 in accordance with the exemplary embodiment includes a transparent substrate 110, the gate line GL, the storage line SL, a gate insulation layer 120, the data line DL, the TFT, a passivation layer 130, and the pixel electrode 140. The TFT includes the gate electrode GE, the source electrode SE, the drain electrode DE, the active layer AT, and the buffer layer CT.

The transparent substrate 110 has a plate shape, and includes a transparent material. Exemplary transparent materials suitable for use as transparent substrate 110 can include, without limitation, glass, quartz, and sapphire, as well as a transparent synthetic resin such as polyester, polyacrylate, polycarbonate, and polyetherketone.

The gate line GL is formed on the transparent substrate 110 in the second direction. The storage line SL is formed on the transparent substrate 110 along the second direction. The gate electrode GE is formed to extend from the gate line GL along the first direction. The gate insulation layer 120 is formed on the transparent substrate 110 to cover the gate line GL, the gate electrode GE, and the storage line SL. An exemplary transparent insulating material suitable for use as the gate insulation layer 120 can include, without limitation, silicon oxide or silicon nitride.

The data line DL is formed on the gate insulation layer 120 extending along the first direction. The source electrode SE is formed to extend from the data line DL along the second direction. The active layer AT is formed on the gate insulation layer 120 to traverse the gate electrode GE. The active layer AT includes a semiconductor layer AT1 and an impurity layer AT2.

The semiconductor layer AT1 is formed on the gate insulation layer 120 to traverse the gate electrode GE. For example, the semiconductor layer AT1 includes amorphous silicon. The impurity layer AT2 is formed on the semiconductor layer AT1. For example, the impurity layer AT2 includes amorphous silicon highly doped with ions. Here, portions of the impurity layer AT2 on the gate electrode GE are partially removed to divide the impurity layer AT2 into two parts.

The buffer layer CT is respectively formed on each part of the impurity layer AT2. The buffer layer CT includes a first connection layer CT1, a second connection layer CT2, and a third connection layer CT3. The first connection layer CT1 is formed on each part of the impurity layer AT2. Exemplary materials suitable for use as the first connection layer CT1 include, without limitation, titanium silicide, molybdenum silicide, and nickel silicide. The thickness of the first connection layer is within a range of between about 50 Å to about 150 Å, and desirably about 100 Å.

The second connection layer CT2 is formed on each part of the first connection layer CT1. Exemplary materials suitable for use as the second connection layer CT2 include, without limitation, titanium, molybdenum, and nickel. The thickness of the second connection layer is within a range of between about 100 Å to about 500 Å, and desirably about 200 Å.

The third connection layer CT3 is formed on each part of the second connection layer CT2. Exemplary materials suitable for use as the third connection layer CT3 include, without limitation, titanium nitride, molybdenum nitride, and nickel nitride. The thickness of the third connection layer CT3 is within a range of between about 100 Å to about 500 Å, and desirably about 100 Å.

The source electrode SE extending from the data line DL is formed on one part of the third connection layer CT3. The drain electrode DE is separated from the source electrode SE by a predetermined distance, and is formed on the other part of the third connection layer CT3. The drain electrode DE extending along the first direction and the second direction is formed on the gate insulation layer 120. Exemplary materials suitable for use as the source electrode SE and the drain electrode DE include, without limitation, a metal such as molybdenum, copper, silver, aluminum, chromium, tantalum, and titanium. The source electrode SE and the drain electrode DE may include a double layer having an aluminum layer and a molybdenum layer.

A passivation layer 130 is formed on the gate insulation layer 120 to cover the film transistor TFT. The passivation layer 130 protects the TFT from external heat or moisture. The passivation layer 130 includes the contact hole 132 formed through the drain electrode DE. Transparent silicon oxide is representative of a suitable material for the passivation layer 130.

The pixel electrode 140 is formed on the passivation layer 130. The pixel electrode 140 is electrically connected to the drain electrode DE through the contact hole 132 of the passivation layer 130.

Figure 4:
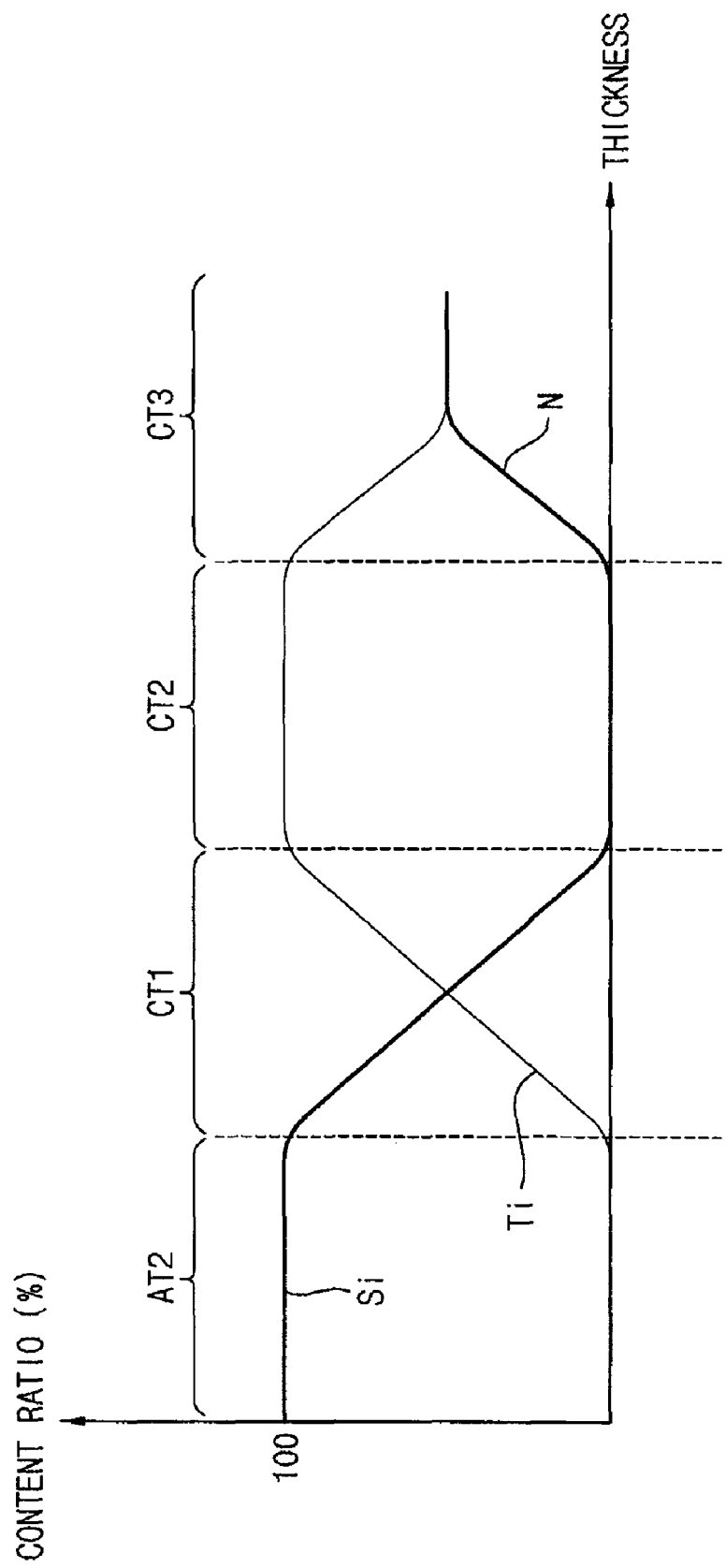
FIG. 4 is a graph illustrating a layer content ratio of a buffer layer in FIG. 3 corresponding to an increase in a thickness of the buffer layer.

FIG. 4 is a graph illustrating a change of content ratio in the composition of buffer layer CT in FIG. 3, corresponding to an increase in a thickness of the buffer layer CT. Referring to FIG. 4, the layer content ratio in the buffer layer CT changes substantially continuously, as the thickness is gradually increased from the first connection layer CT1 toward the third connection layer CT3. For example, the first connection layer CT1 includes titanium silicide, the second connection layer CT2 includes titanium, and the third connection layer CT3 includes titanium nitride.

More particularly, as the thickness of the first connection layer CT1 is increased, a content of titanium is substantially continuously increased and correspondingly a content of silicon is gradually decreased. The second connection layer CT2 is formed after the content of silicon in the buffer layer CT1 is decreased to become substantially completely removed. Here, although the content of silicon in the impurity layer AT2 illustrated in FIG. 4 up to about 100%, an impurity from an element in Group V, including without limitation, phosphorus, arsenic, or antimony, may be contained in the impurity layer AT 2.

The second connection layer CT2 has a predetermined thickness, and can include titanium. While the thickness of the second connection layer CT2 is being increased, nitrogen is generated in the buffer layer CT, thus forming the third connection layer CT3. The content of nitrogen in the third connection layer CT3 increases substantially continuously corresponding to an increase in the thickness of the third connection layer CT3 and, correspondingly, the content of titanium is gradually and substantially continuously decreased. Desirably, the content of titanium is decreased to be substantially the same as that of nitrogen, and it also is desirable that the content of titanium is maintained to be substantially the same as that of nitrogen. Thus, the content of nitrogen may be increased substantially continuously corresponding to an increase in the thickness of the third connection layer CT3, and correspondingly the content of titanium is substantially continuously decreased. Alternatively, in the third connection layer CT3, the layer content ratio of titanium relative to nitrogen may be maintained as a different ratio from a usual layer content ratio of about 1:1.

In an exemplary embodiment, the first connection layer CT1 includes titanium silicide, the second connection layer CT2 includes titanium, and the third connection layer CT3 includes titanium nitride. In general, as the thickness of the buffer layer CT is increased, the layer content ratio correspondingly changes substantially continuously. Alternatively the first connection layer CT1 may include molybdenum silicide, the second connection layer CT2 may include molybdenum, and the third connection layer CT3 may include molybdenum nitride. Moreover, the first connection layer CT1 may include nickel silicide, the second connection layer CT2 may include nickel, and the third connection layer CT3 may include nickel nitride. As mentioned above, the layer content ratio may change substantially continuously corresponding to an increase in the thickness of the buffer layer CT.

According to an exemplary embodiment, as the third connection layer CT3, including titanium nitride, is formed, oxidation of a surface of the buffer layer CT is suppressed. In addition, an increase in the contact resistance, between the source electrode SE and the active layer AT, and between the drain electrode DE and the active layer AT, may be suppressed. As the thickness of the buffer layer CT is increased, the corresponding layer content ratio of silicon, titanium and nitrogen decreases or is substantially continuously increased. Therefore, a stress caused by an abrupt change of the content ratio in the buffer layer CT may be reduced. Moreover, as the second connection layer CT2 is formed to have a predetermined thickness, a stress generated in the buffer layer CT may be reduced further.

In an exemplary embodiment of the present invention, although the buffer layer CT includes the first connection layer CT1, the second connection layer CT2 and the third connection layer CT3, the second connection layer CT2 may have a minimal thickness. Alternatively, second connection layer CT2 may be excluded.

Exemplary Embodiments of Method of Manufacturing a LCD Panel

Figure 5:
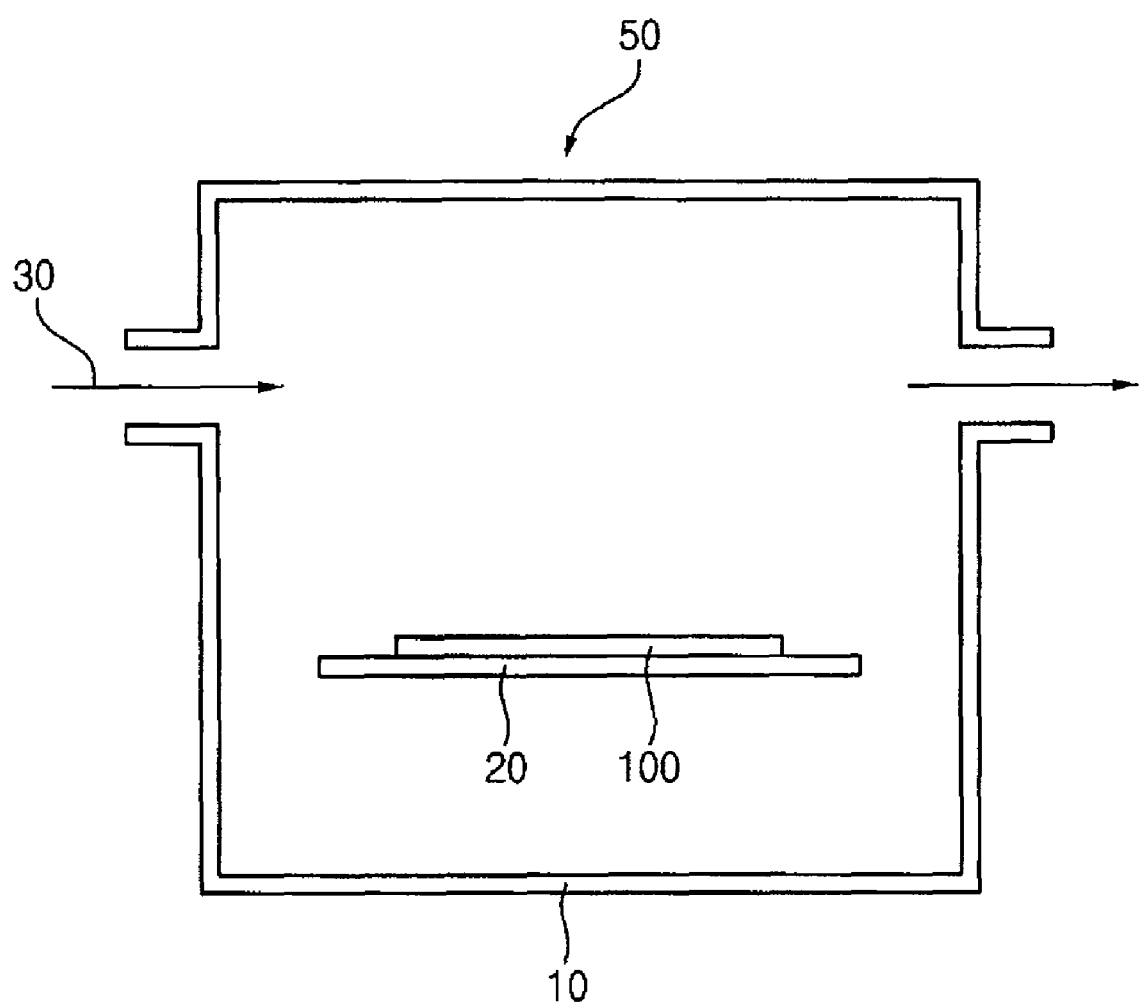
FIG. 5 is a cross-sectional view conceptually illustrating an apparatus for manufacturing a liquid crystal display panel in accordance with an exemplary embodiment of the present invention.

FIG. 5 is a cross-sectional view illustrating an apparatus for manufacturing a liquid crystal display (LCD) panel in accordance with an exemplary embodiment of the present invention. FIGS. 6A to 6L are cross-sectional views illustrating a method of manufacturing the L panel using the apparatus illustrated in FIG. 5.

The apparatus for manufacturing the LCD panel and thereafter, the method of manufacturing the LCD panel are briefly described as follows. Referring to FIG. 5, an apparatus 50 for manufacturing the LCD panel in accordance with the exemplary embodiment includes a chamber 10 and a stage 20.

The chamber 10 includes an inner space for forming vacuum state. A stage 20 is disposed to support a first substrate 100 in the inner space. Openings are formed through walls of the chamber 10 to provide a gas inlet and a gas outlet for the chamber 10. Selected reaction gases may be used to manufacture the LCD panel in the chamber 10. The reaction gases are introduced into the chamber 10 through the gas inlet, are reacted with the first substrate 100, and then are emitted from the gas outlet of chamber 10. Exemplary reaction gases include without limitation a hydrogen gas ($H_2$), a silane gas ($SiH_4$), a phosphine gas ($PH_3$), an ammonia gas ($NH_3$), a titanium chloride gas ($TiCl_4$), a chlorine-containing gas, or a fluorine-containing gas.

Figure 6A:
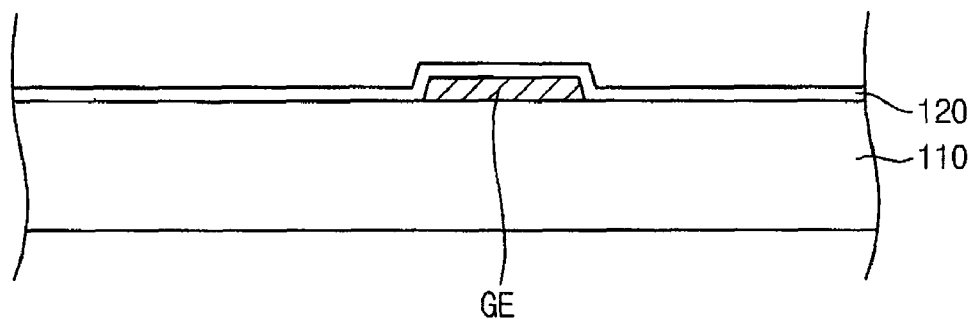
FIGS. 6A to 6L are cross-sectional views illustrating a method of manufacturing a liquid crystal display panel using the apparatus in FIG. 5.
Figure 6B:
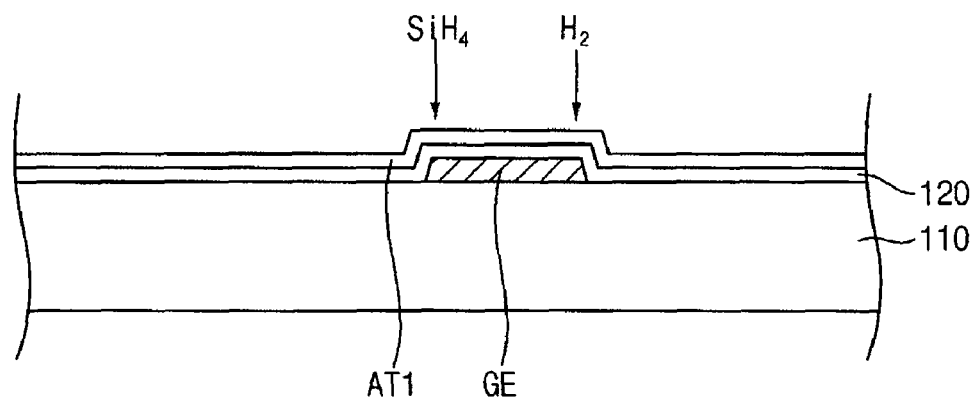
Figure 6C:
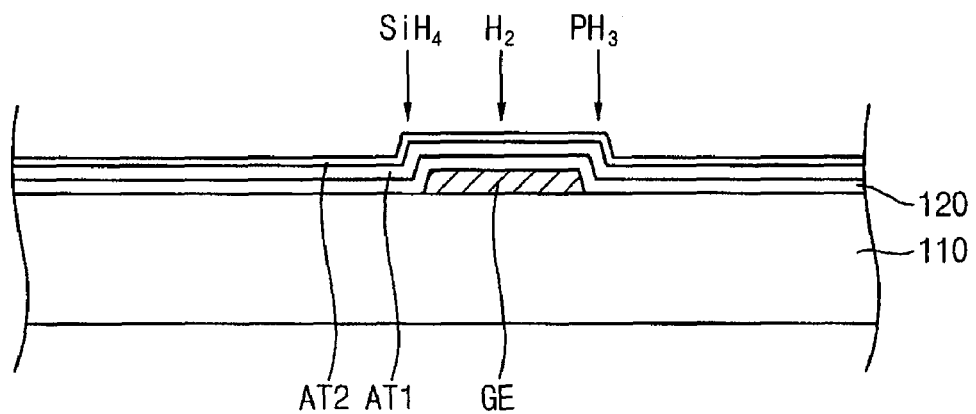

The method of manufacturing the LCD panel in accordance with the exemplary embodiment of the present invention is illustrated hereinafter. Referring to FIGS. 6A and 2, a gate electrode GE is formed on a transparent substrate 110. A gate insulation layer 120 is formed on the gate electrode GE to cover the gate electrode GE. The gate electrode GE is formed on the transparent substrate 100 by depositing a metal by a sputtering process or a chemical vapor deposition (CVD) process. Desirably, the gate electrode GE is formed by the sputtering process. Metals suitable for use as the gate electrode GE include without limitation such as molybdenum, copper, silver, aluminum, chromium, tantalum, or titanium. A gate line GL, a storage line SL, and a storage electrode STE can be formed substantially simultaneously with the formation of gate electrode GE on the transparent substrate 110, Referring to FIGS. 6B and 2, a semiconductor layer AT1, which may include amorphous silicon, can be formed on the gate insulation layer 120 by successively introducing a hydrogen gas ($H_2$) and a silane gas ($SiH_4$) into the chamber 10, using a plasma enhanced chemical vapor deposition (PECVD) process. Referring to FIGS. 6C and 2, an impurity layer AT2 is sequentially formed on the semiconductor layer AT1, using a plasma enhanced chemical vapor deposition (PECVD) process, with an exemplary impurity including amorphous silicon, highly doped with ions. Particularly, after the semiconductor layer AT1 is formed, phosphine gas ($PH_3$), Hydrogen gas ($H_2$), and silane gas ($SiH_4$) are successively introduced into the chamber 10, with the impurity layer AT2 being formed using a plasma enhanced chemical vapor deposition (PECVD) process. In place of phosphine gas ($PH_3$) may be substituted an arsenic hydride gas ($AsH_3$), or an antimony hydride gas ($SbH_3$).

Figure 6D:
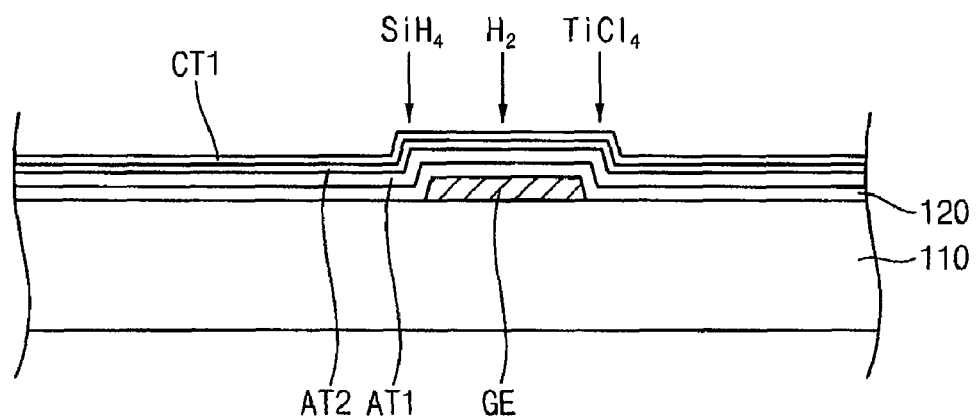

Referring to FIGS. 6D and 2, a first connection layer CT1 is sequentially formed on the impurity layer AT2 by successively introducing hydrogen gas ($H_2$), silane gas ($SiH_4$), and titanium chloride gas ($TiCl_4$) into chamber 10. The first connection layer CT1 may be formed to a thickness of about 100 Å by a plasma enhanced chemical vapor deposition (PECVD) process. A suitable exemplary material for the first connection layer CT1 includes titanium silicide.

In an exemplary embodiment is desirable to gradually increase a flow rate of the titanium chloride gas ($TiCl_4$) as the PECVD process progresses, thereby decreasing the content of the silicon, and increasing the content of titanium, as a corresponding thickness of the first connection layer CT1 is increased.

Figure 6E:
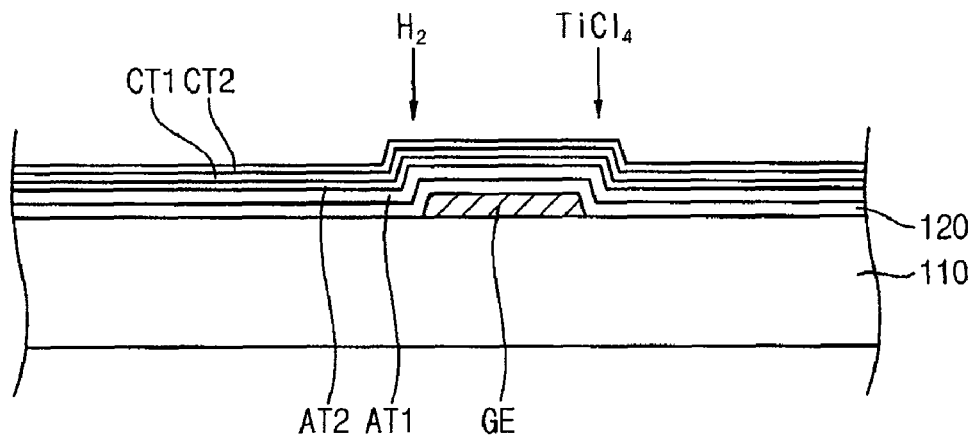

Referring to FIGS. 6E and 2, a second connection layer CT2 is sequentially formed on the first connection layer CT1. For example, the second connection layer CT2 includes titanium. The second connection layer may be formed to the thickness of about 200 Å by a plasma enhanced chemical vapor deposition (PECVD) process, by sequentially introducing into the chamber 10 hydrogen gas ($H_2$) and titanium chloride gas ($TiCl_4$), but generally excluding silane gas ($SiH_4$). Alternatively, the second connection layer CT2 may be excluded while forming the buffer layer CT.

Figure 6F:
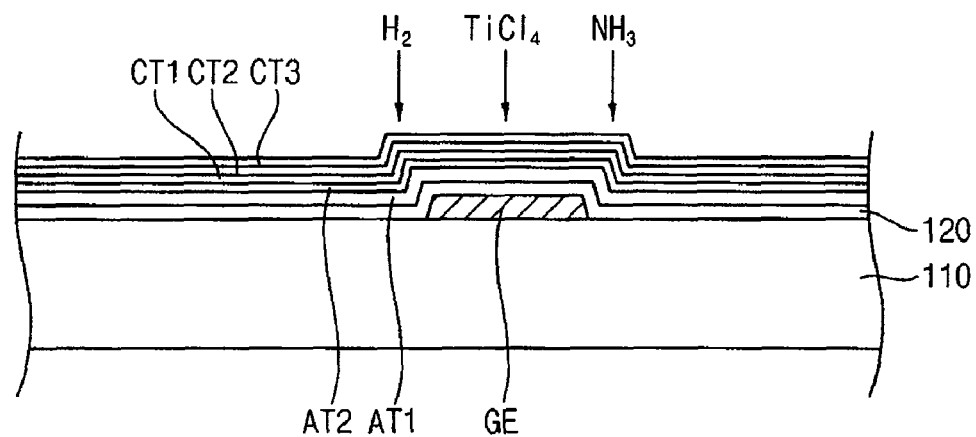

Referring to FIGS. 6F and 2, the third connection layer CT3 is sequentially formed on the second connection layer CT2 by successively introducing into chamber 10, ammonia gas ($NH_3$), hydrogen gas ($H_2$) and titanium chloride gas ($TiCl_4$). The third connection layer CT3 is formed to a thickness of above about 100 Å, for example, using titanium nitride, by a plasma enhanced chemical vapor deposition (PECVD) process.

In an exemplary embodiment of the present invention, it is desirable to decrease gradually the flow rate of the titanium chloride gas ($TiCl_4$) and to increase gradually the flow rate of ammonia gas, as the PECVD process progresses. As a result, the content of titanium is gradually decreased, and the content of nitrogen is increased as a corresponding thickness of the first connection layer CT3 is increased.

Figure 6G:
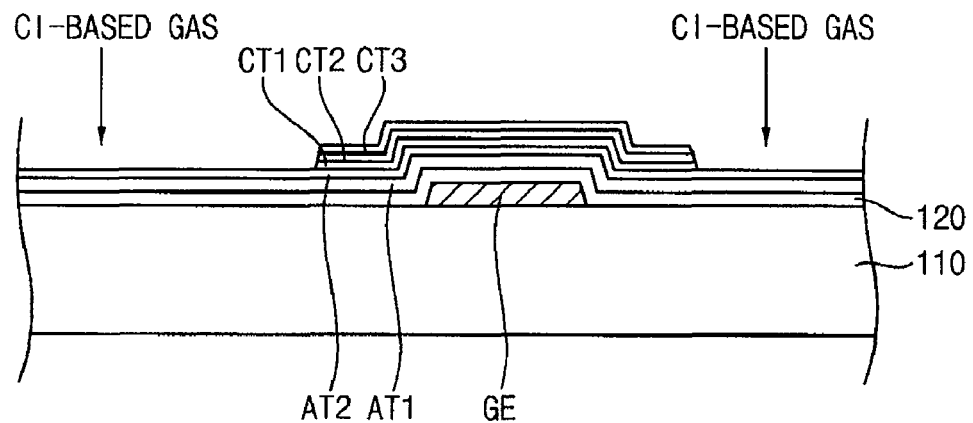

Referring to FIGS. 6G and 2, after the third connection layer CT3 is formed, a predefined portion of the buffer layer CT is primarily etched, for example, by sequentially etching portions of the third connection layer CT3, the second connection layer CT2 and the first connection layer CT1. The etching process of the third connection layer CT3, the second connection layer CT2 and the first connection layer CT1 may be performed using a chlorine-containing gas, such as chlorine gas ($Cl_2$). In addition, it may be advantageous to sequentially etch the third connection layer CT3, the second connection layer CT2 and the first layer CT1 after a hardened photoresist is formed on the portion of the third connection layer CT3.

Figure 6H:
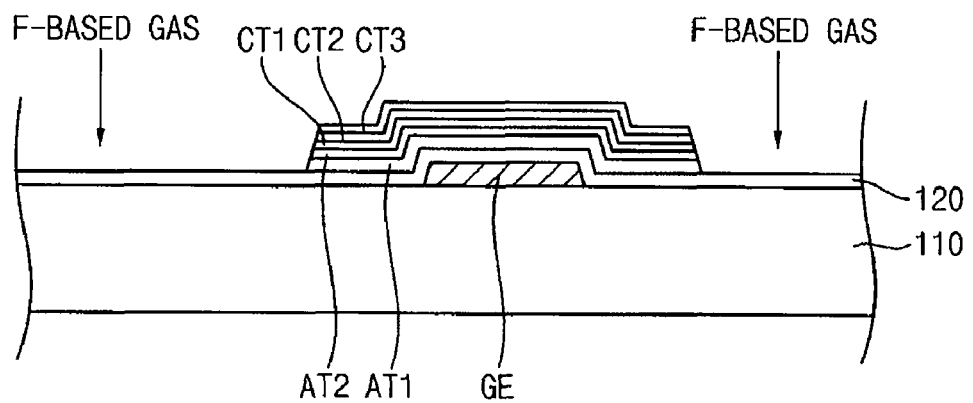

Referring to FIGS. 6H and 2, a portion of the active layer AT, including the impurity layer AT2 and the semiconductor layer AT1, is primarily etched, after the predefined portion of the buffer layer CT is primarily etched. The etching process of the impurity layer AT2 and the semiconductor layer AT1 may be performed using a fluorine-containing gas, including without limitation, sulfur hexafluoride gas ($SF_6$), and carbon tetrafluoride ($CF_4$).

In general, titanium nitride is less susceptible to etching by the fluorine-containing gas relative to the impurity layer AT2 and the semiconductor layer AT1. Therefore, buffer layer CT, including third connection layer CT3, may be used as an etching mask for the impurity layer AT2 and the semiconductor layer AT1. Alternatively, the impurity layer AT2 and the semiconductor layer AT1 may be etched after the application of an additional photoresist (not shown).

Figure 6I:
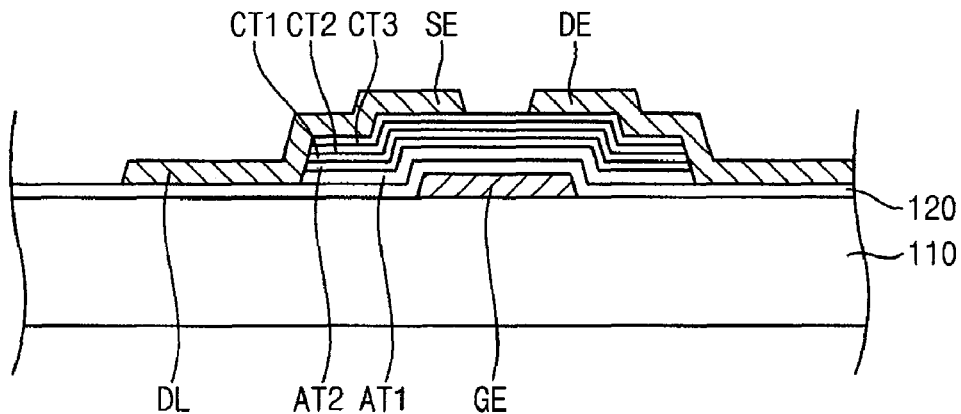

Referring to the FIGS. 6I and 2, a source electrode SE and a drain electrode DE are formed on the gate insulation layer 120, after the predefined portion of the active layer AT is primarily etched The source electrode SE and the drain electrode DE are formed on the gate insulation layer 120 to be overlapped with predefined portions of the etched third connection layer CT3. The source electrode SE and the drain electrode DE are formed to face with each other, and to be separated by a predetermined distance. In one aspect, the source electrode SE and the drain electrode DE include a double layer having an aluminum layer and a molybdenum layer. After the aluminum layer is formed on the insulation layer 120 by a plasma deposition process, the molybdenum layer is sequentially formed on the aluminum layer. The source electrode SE and the drain electrode DE are formed and separated by a predetermined distance by partially etching the aluminum layer and molybdenum layer using an additional photoresist.

Figure 6J:
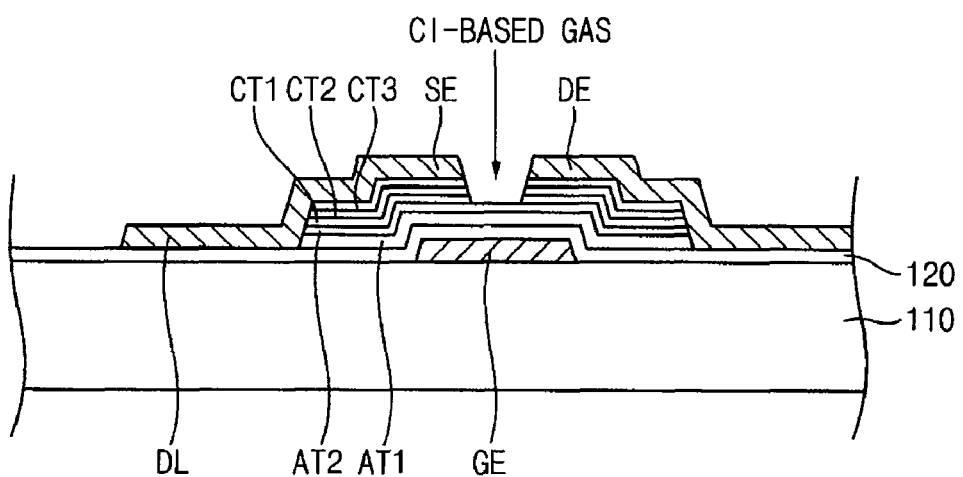

Referring to FIGS. 6J and 2, after formation of source electrode SE and drain electrode DE, a predefined portion of the buffer layer CT is secondarily etched using the source electrode SE and the drain electrode DE as an etching mask, with etching being performed using a chlorine-containing gas, for example, chlorine gas ($Cl_2$). This buffer layer portion can include the third connection layer CT3, the second connection layer CT2 and the first connection layer CT1.

Figure 6K:
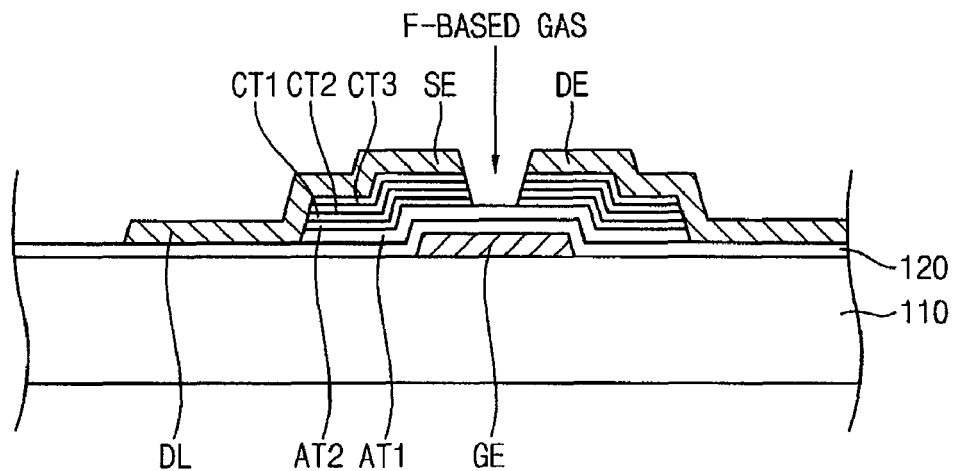

Referring to FIGS. 6K and 2, after the portion of the buffer layer CT is etched, a portion of impurity layer AT2 is secondarily etched using the source electrode SE and the drain electrode DE as an etching mask, with the etching process being performed using a fluorine-containing gas, including without limitation, sulfur hexafluoride gas ($SF_6$), and carbon tetrafluoride gas ($CF_4$).

Figure 6L:
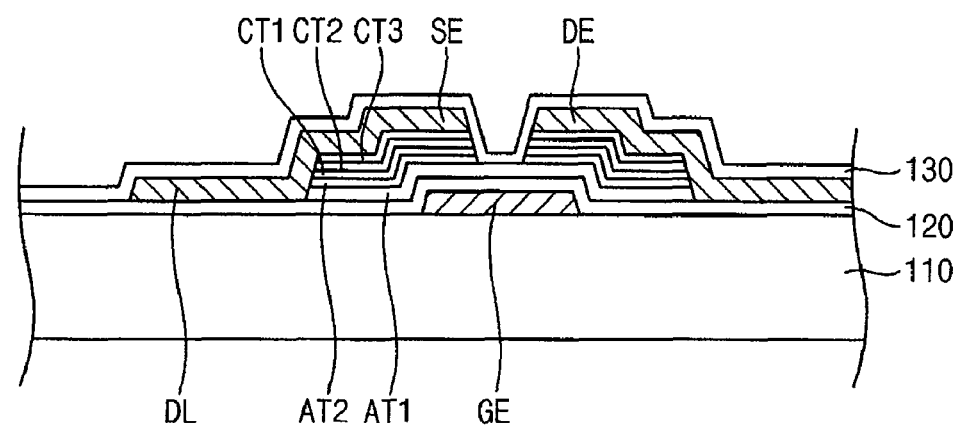

Referring to FIGS. 6L and 2, a passivation layer 130 is formed on the entire substrate to cover the thin-film transistor. A pixel electrode 140 is formed on the passivation layer 130.

In accordance with an exemplary embodiment, after the semiconductor layer AT1 is formed on the gate insulation layer 120, the impurity layer AT2, the first connection layer CT1, the second connection layer CT2, and the third connection layer CT3 are sequentially formed by in-situ processes. In-situ processes are desirable to suppress the formation of an interfacial oxide layer, as a result of native oxidation occurring between the layers. The semiconductor layer AT1, the impurity layer AT2, the first connection layer CT1, the second connection layer CT2, and the third connection layer CT3 may be sequentially formed by substantially continuously introducing selected reaction gases 30 into the chamber 10, so that the interfacial oxide layer between the above-mentioned layers caused by a native oxidation may not be formed, and an increase of contact resistance may be suppressed.

When the reaction gas 30 having a substantially continuously varying gas content ratio is introduced into the chamber 10, the layer content ratio of the buffer layer CT may be gradually changed as the corresponding thickness of the buffer layer CT is gradually increased, thereby suppressing the formation of a stress caused by an abrupt change of the layer content ratio in the buffer layer CT.

In accordance with an exemplary embodiments of the present invention, a selected reaction gas 30 introduced into the chamber 10 can include, without limitation, one of titanium chloride gas ($TiCl_4$), molybdenum chloride gas ($MoCl_6$), or nickel chloride gas (NiCl).

In general, the metallic constituent of reaction gas 30 influences the metal content of the connection layers formed using gas 30. For example, in addition to the formation of connection layers having titanium content, as described above, when the molybdenum chloride gas ($MoCl_6$) is introduced into the chamber 10, the first connection layer may include molybdenum silicide, the second connection layer may include molybdenum, and the third connection layer may include molybdenum nitride. Similarly, when the nickel chloride gas (NiCl) is introduced into the chamber 10, the first connection layer may include nickel silicide, the second connection layer may include nickel, and the third connection layer may include nickel nitride.

Exemplary Embodiments of an Electro-Luminescence Display Panel

Figure 7:
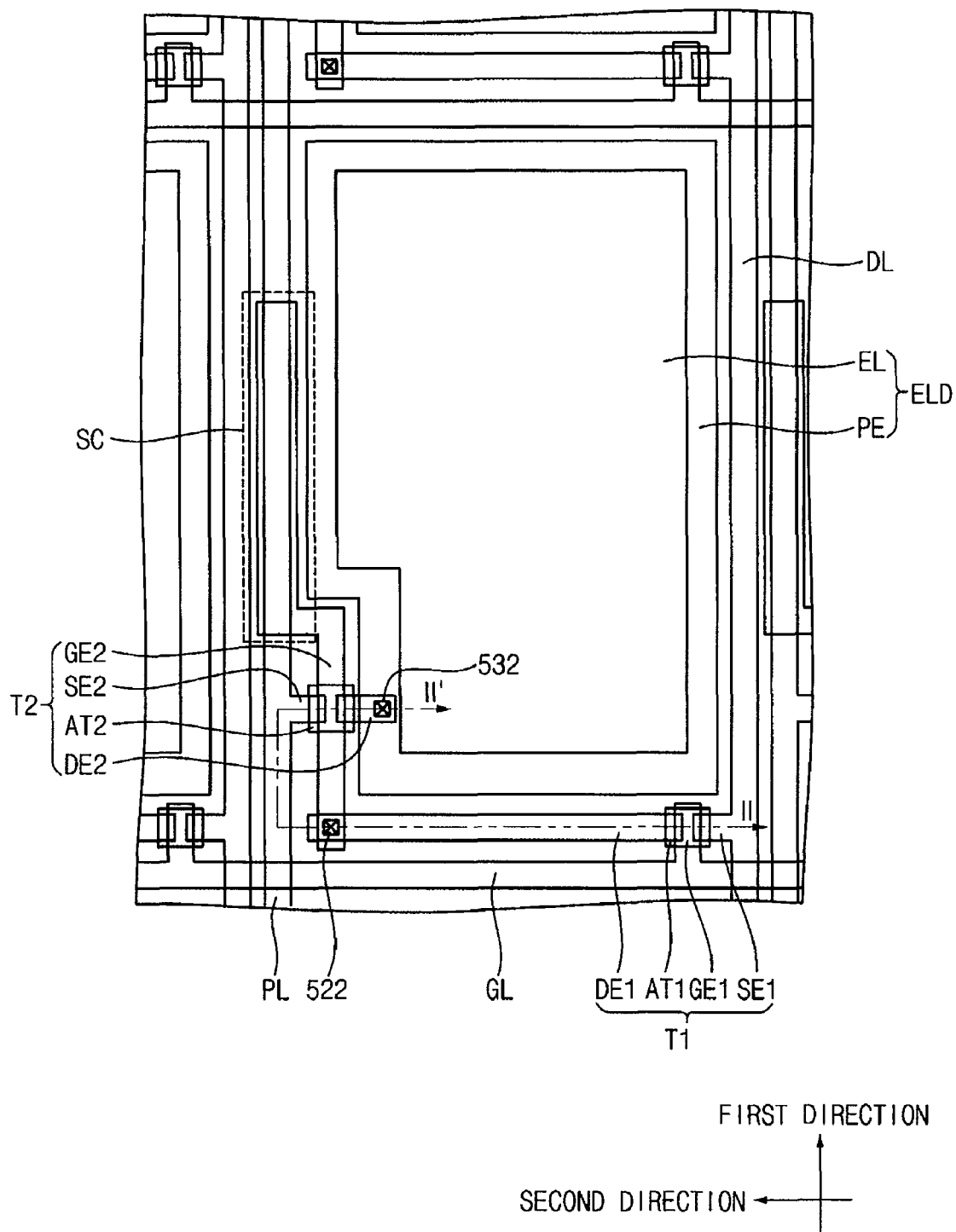
FIG. 7 is a plane view illustrating a portion of an electro-luminescence display panel in accordance with an exemplary embodiment of the present invention.

FIG. 7 is a plane view illustrating a portion of an electro-luminescence display panel in accordance with an exemplary embodiment of the present invention. FIG. 8 is a cross-sectional view taken along a line II-IF in FIG. 7.

Referring to FIGS. 7 and 8, the electro-luminescence display panel 500 includes a data line DL, a gate line GL, a power line PL, an electro-luminescence device (ELD), a switching TFT (TFT) T1, a driving TFT T2, and the storage capacitor SC.

The data line DL is formed to extend along a first direction, and a plurality of the data lines is formed in parallel with a second direction. The data line DL is electrically connected to the switching TFT T1 for applying a data signal to the switching TFT T1.

The gate line GL is formed to extend along the second direction to cross the data line DL, and a plurality of the gate lines GL is formed in parallel with the first direction. Typically, the first direction is perpendicular to the second direction. In general, a unit pixel is formed where a data line DL and a gate line GL intersect. Thus, the intersections of data lines DL and the gate lines GL define a plurality of unit pixels. Each of the unit pixels includes the ELD, the switching TFT T1, the driving TFT T2, and storage capacitor SC.

The power line PL is formed in parallel with the data line DL and, is separated from the data line DL by a predetermined distance in the second direction. The power line PL is electrically connected to the driving TFT T2 to apply a driving current to the driving TFT T2.

Typically, an ELD subjected to an electric field spontaneously generates light. The ELD may generate a different color of light for each unit pixel, and may generate a red light, a green light, or a blue light. The ELD includes a positive electrode (or anode) PE, an electro-luminescence layer EL, and a negative electrode (or cathode) NE. Typically, the electro-luminescence layer EL is formed between the positive electrode PE and the negative electrode NE. The positive electrode PE is formed in the unit pixel, and is electrically connected to the driving TFT T2. The positive electrode PE receives the driving current from the driving TFT T2 and generates an electric field between the positive electrode PE and the negative electrode NE.

The electro-luminescence layer EL is formed on the positive electrode PE. The electro-luminescence layer EL generates the light by the electric field applied between the two electrodes. For example, the electro-luminescence layer EL includes an organic electro-luminescence material, and may include a hole injection layer, a hole transportation layer, a luminescence layer, an electron injection layer, and an electron transportation layer.

The negative electrode is formed on the electro-luminescence layer EL to cover substantially the entire substrate. The negative electrode NE is provided with a common voltage from an external voltage source, and generates the electric field between the positive electrode PE and the negative electrode NE.

Here, at least one of the positive electrode PE and the negative electrode NE includes a transparent material to transmit the light generated from the electro-luminescence layer EL. For example, at least one of the positive electrode PE and the negative electrode NE is formed by patterning the transparent material by a photo process and a etching process. The transparent material can include without limitation indium tin oxide (ITO), indium zinc oxide (IZO), or amorphous indium tin oxide (a-ITO).

A brief description with regards to a principle of generating light from the electro-luminescence layer follows. The positive electrode PE receives the driving current from the driving TFT T2. The common voltage provided from an external voltage source is applied to the negative electrode NE. The positive electrode PE is provided with holes by the driving current and the negative electrode NE is provided with electrons by the common voltage. Alternatively, the positive electrode PE may be provided with electrons and the negative electrode NE may be provided with holes.

Driven by the electric field between the electrodes, the holes provided from the positive electrode PE combine with the electrons provided from the negative electrode NE in the electro-luminescence layer EL, to generate an exciton having an excited state. Light is generated when the exciton moves from the excited state to the ground state The switching TFT T1, formed in the unit pixel, TFT includes a switching gate electrode GE1, a switching source electrode SE1, a switching drain electrode DE1, a switching active layer AT1, and a switching buffer layer CT2.

The switching gate electrode GE1 is formed to extend from the gate line GL along the first direction. The switching source electrode SE1 is formed to extend from the data line DL along the second direction, and to be overlapped with some definable portions of the switching gate electrode GE1. The switching drain electrode DE1 is formed to face switching source electrode SE1, and to be separated from the switching source electrode SE1 by a predetermined distance. The switching drain electrode DE1 is formed to be overlapped with predefined portions of the switching gate electrode GE1. The switching drain electrode DE1 is formed to extend along the second direction, and is electrically connected through a first contact hole 522 to the drain electrode GE2 of the driving TFT T2.

The switching active layer AT1 is formed on a gate oxidation layer 520 to cover the switching gate electrode GE1, and to be positioned between the switching gate electrode GE1 and the switching source electrode SE1, and between the switching gate electrode GE1 and the switching drain source electrode DE1. The switching buffer layer, which suppresses an increase of a contact resistance, is formed on the switching active layer AT1 to be positioned between the switching active layer AT1 and the switching source electrode SE1, and between the switching active layer AT1 and the switching drain electrode DE1.

The driving TFT T2 is formed in the unit pixel, TFT including a driving gate electrode GE2, a driving source electrode SE2, a driving drain electrode DE2, a driving active layer AT2, and a driving buffer layer CT2.

The driving gate electrode GE2 extends along the first direction, and is formed to be electrically connected through the first contact hole 522 to the switching drain electrode DE1. The driving source electrode SE2 is formed extending along a reverse direction of the second direction from the power line PL, to be overlapped with predefined portions of the driving gate electrode GE2. The driving drain electrode DE2 is formed to face, and to be separated from, the driving source electrode SE2. The driving drain electrode DE2 is formed to extend along a reverse direction of the second direction and is overlapped with predefined portions of the driving gate electrode GE2. The driving drain electrode DE2 is electrically connected through a second contact hole 532 to the positive electrode PE of the electro-luminescence device ELD.

The driving active layer AT2 is formed on the gate oxidation layer 520 to cover the driving gate electrode GE2, and to be positioned between the driving gate electrode GE2 and the driving source electrode SE2, and between the driving gate electrode GE2 and the driving drain electrode DE2. The driving buffer layer suppresses an increase of a contact resistance, and is formed on the driving active layer AT2 to be positioned between the driving active layer AT2 and the driving source electrode SE2, and between the driving active layer AT2 and the drain electrode DE2.

A storage capacitor SC includes a first electrode and a second electrode and is formed in the unit pixel to maintain a driving voltage applied to the driving gate electrode GE2. Here, the first electrode includes the driving gate electrode GE2 extending along the second direction and the second electrode includes the power line PL.

A procedure to operate the switching TFT T1 and the driving TFT T2 is briefly described as follows. A driving voltage, which is applied to the switching source electrode SE1 through the data line DL, is transmitted to the switching drain electrode DE1 through the switching active layer AT1, when a turn-on voltage is applied to the switching gate electrode GE1.

The driving voltage applied to the driving gate electrode GE2 is maintained at the storage capacitor and creates a channel layer in the driving active layer AT2. Through the channel layer, the driving source electrode SE2 and the driving drain electrode DE2 are electrically connected with each other, so that a driving current in the power line is transmitted to the driving drain electrode DE2.

Also referring to FIGS. 7 and 8, an exemplary embodiment of an electro-luminescence display panel 500 includes a base substrate 510, a gate line GL, a gate insulation layer 520, the data line DL, the power line PL, the switching TFT T1, the driving TFT T2, a passivation layer 530, a bank layer 540, and the electro-luminescence device ELD. Here, the switching TFT T1 includes the switching gate electrode GE1, the switching source electrode SE1, the switching drain electrode DE1, the switching active layer AT1 and a switching buffer layer CT1. The driving TFT T2 includes the driving gate electrode GE2, the driving source electrode SE2, the driving drain electrode DE2, the driving active layer AT2, and a driving buffer layer CT2.

The base substrate 510 may have a plate shape and include a transparent material including without limitation glass or quartz.

The gate line GL is formed on the base substrate 510 in the second direction. The switching gate electrode GE1 is formed along the first direction, extending from the gate line GL. The driving gate electrode GE2 is formed extending along the first direction by a predetermined length.

The gate insulation layer 520 is formed on the base substrate 510 to cover the gate line GL, the switching gate electrode GE1, and the driving gate electrode GE2. Desirably, the gate insulation layer 520 is a transparent insulation material including without limitation, silicon oxide or silicon nitride. The gate insulation layer 520 includes a first contact hole 522, electrically connecting the switching drain electrode DE1 to the driving gate electrode GE2.

The data line DL is formed on the gate insulation layer 520, extending along the first direction. The switching source electrode SE1 is formed extending from the date line along the second direction.

The power line PL is formed on the gate insulation layer 520, in parallel with the data line DL. The driving source electrode SE2 is formed extending from the power line PL along a reverse direction of the second direction.

The switching active layer AT1 is formed on the gate insulation layer 520 to traverse the switching gate electrode GE1. The driving active layer AT2 is formed on the gate insulation layer 520 to traverse the driving gate electrode GE2. Here, the switching active layer AT1 includes a first semiconductor layer AT1-A, and a first impurity layer AT1-B. Similarly, the driving active layer AT2 includes a second semiconductor layer AT2-A, and a second impurity layer AT2-B.

The first semiconductor layer AT1-A is formed on the gate insulation layer 520 to traverse the switching gate electrode GE1, and may include amorphous silicon. The first impurity layer AT1-B is formed on the first semiconductor layer AT1-A, and may include amorphous silicon highly doped with ions. Desirably, a portion of the first impurity layer AT1-B formed on the switching gate electrode GE1 is partially removed so that the first impurity layer AT1-B is divided.

The second semiconductor layer AT2-A is formed on the gate insulation layer 520 to traverse the driving gate electrode GE2, and may include amorphous silicon. The second impurity layer AT2-B is formed on the second semiconductor layer AT2-A, and may include amorphous silicon highly doped with ions. Desirably, a portion of the second impurity layer AT2-B, formed on the switching gate electrode GE1, is partially removed so that the second impurity layer AT2-B is divided.

A pair of the switching buffer layers CT1 is formed on each side of the divided first impurity layers AT1-B, respectively. Each of the paired switching buffer layer CT1 includes a first switching connection layer CT1-A, a second switching connection layer CT1-B, and a third connection layer CT1-C.

The first switching connection layer CT1-A is formed on the first impurity layer AT1-B, and may include without limitation, titanium silicide, molybdenum silicide, or nickel silicide. Desirably, the first switching connection layer CT1-A has a thickness of about 100 Å.

The second switching connection layer CT1-B is formed on the first switching connection layer CT1-A, has a thickness of about 200 Å, and may include, without limitation, titanium, molybdenum, or nickel.

The third switching connection layer CT1-C is formed on the second switching connection layer CT1-B, has a thickness of about no less than 100 Å, and may include, without limitation, titanium nitride, molybdenum nitride, or nickel nitride, etc.

Desirably, a layer content ratio of the switching connection layer CT1 varies gradually and substantially continuously as a corresponding thickness of the switching connection layer CT1 is gradually increased from the first switching connection layer CT1-A to the third switching connection layer CT1-C, inclusive.

A pair of the driving buffer layers CT2 is formed on each side of the divided second impurity layers AT2-B, respectively. Each of the paired driving buffer layers CT2 includes a first driving connection layer CT2-A, a second driving connection layer CT2-B, and a third driving connection layer CT2-C.

The first driving connection layer CT2-A is formed on the second impurity layer AT2-B, has a thickness of about 100 Å, and may include, without limitation, titanium silicide, molybdenum silicide, or nickel silicide.

The second driving connection layer CT2-B is formed on the first driving connection layer CT2-A, has a thickness of about 200 Å, and may include, without limitation, titanium, molybdenum, or nickel.

The third driving connection layer CT2-C is formed on the second driving connection layer CT2-B, has a thickness of about no less than 100 Å, and may include, without limitation, titanium nitride, molybdenum nitride, or nickel nitride.

A layer content ratio of the driving connection layer CT2 varies gradually and substantially continuously as a corresponding thickness of the driving connection layer CT2 is gradually increased from the first driving connection layer CT2-A to the third driving connection layer CT2-C, inclusive.

The switching source electrode SE1 extending from the data line DL is formed on an upper face of the one side of the third switching connection layer CT1-C. The switching drain electrode DE1 is formed on an upper face of the other side of the third switching connection layer CT1-C, and is separated from the switching source electrode SE1 by a predetermined distance. The switching drain electrode DE1 is formed on the gate insulation layer 520 extending along the second direction. Desirably, each of the switching source electrode SE1 and the switching drain electrode DE1 include a double layer, having an aluminum layer and a molybdenum layer.

The driving source electrode SE2 extending from the power line PL is formed on an upper face of the one side of the third driving connection layer CT2-C. The driving drain electrode DE2 is formed on an upper face of the other side of the third driving connection layer CT2-C, and is spaced apart from the driving source electrode SE2. The driving drain electrode DE2 is formed on the gate insulation layer 520 extending to a reverse direction of the second direction. Desirably, each of the driving source electrode SE2 and the driving drain electrode DE2 include a double layer having an aluminum layer and a molybdenum layer.

The passivation layer 530 is formed on the gate insulation layer 520 to cover the switching TFT T1 and the driving TFT T2, protecting the switching TFT T1 and the driving TFT T2 from external heat or moisture. The passivation layer 530 is formed on the driving drain electrode DE2, with the second contact hole 532 electrically connecting the driving drain electrode DE2 to the positive electrode PE. Transparent silicon oxide can be a suitable material for use as the passivation layer 530.

The positive electrode PE is formed on the gate insulation layer 520, and is electrically connected to the driving drain electrode DE2 through the second contact hole 532. The bank layer 540 is formed on the passivation layer 530, and has an opening corresponding to the positive electrode PE. The electro-luminescence layer EL is formed in the opening of the bank layer 540. The negative electrode NE is formed on the entire substrate so that the negative electrode NE contacts an upper face of the electro-luminescence layer EL and an upper face of the bank layer 540.

According to an exemplary embodiment, the third switching connection layer CT1-C is formed over the switching active layer AT1 as the top layer of the switching buffer layer CT1; and the third driving connection layer CT2-C is formed on the driving active layer AT2 as the top layer of the driving buffer layer CT2. Buffer layers CT1 and CT2 suppress oxidation of the switching active layer AT1 and the driving active layer AT2, respectively, and therefore to suppress an increase of the contact resistance caused by the oxidation of the switching active layer AT1 and the driving active layer AT2.

In general, an increase of a contact resistance may be suppressed by forming a buffer layer between a source electrode and an active layer, and between a drain electrode and an active layer. It is desirable to suppress an increase in contact resistance between the driving active layer AT2 and the driving source electrode SE2, as well as between the driving active layer AT2 and the driving drain electrode DE2, in order to improve a display quality of a liquid display panel or an electro-luminescence display panel. In certain embodiments according to the present invention, suppressing an increase in contact resistance is desirable because an electro-luminescence device ELD generates the light by a current-driving mode, and not by a voltage-driving mode. and Thus, it is advantageous to form driving buffer layer CT2 to suppress increases in the contact resistance between the driving active layer AT2 and the driving source electrode SE2, as well as between the driving active layer AT2 and the driving drain electrode DE2, thereby allowing the ELD to operate more efficiently in the current driving mode.

In certain other embodiments according to the present invention, it is desirable to suppress an increase in the contact resistance so that the electrical characteristics of a TFT may be improved.

It also is desirable to introduce into a chamber selected reaction gases having a substantially continuously varying gas content ratio, such that the resulting buffer layer may have a substantially continuously changing layer content ratio in proportion to a thickness of the buffer layer, thereby suppressing a stress caused by an abrupt change of the buffer layer content ratio.

The foregoing is illustrative of the present invention and is not to be construed as limiting thereof. Although a few exemplary embodiments of the present invention have been described, those skilled in the art will readily appreciate that many modifications are possible without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a thin-film transistor comprising:
    forming a gate electrode on a base substrate;
    forming a gate insulation layer on the substrate to cover the gate electrode;
    forming an active layer on the gate insulation layer to cover the gate electrode;
    forming a buffer layer on the active layer to suppress oxidation of the active layer, the buffer layer comprising a first connection layer;
    forming the first connection layer using at least a first gas in a deposition process;
    gradually increasing a flow rate of the first gas as the deposition process progresses;
    primarily etching first predefined portions of the buffer layer and the active layer;
    forming a source electrode and a drain electrode on the primarily etched active layer, wherein the source electrode and the drain electrode are separated from each other by a predetermined distance; and
    secondarily etching second predefined portions of the buffer layer and the active layer, using as an etching mask at least one of the source electrode and the drain electrode.

2. The method of claim 1, wherein the buffer layer comprises a plurality of layers formed by an in-situ process on the active layer.

3. The method of claim 1, wherein the buffer layer further comprises a second connection layer and a third connection layer.

4. The method of claim 1, wherein the active layer comprises silicon.

5. The method of claim 3, wherein the first connection layer comprises titanium silicide, wherein the second connection layer comprises titanium, and wherein the third connection layer comprises titanium nitride.

6. The method of claim 5, wherein the first connection layer is formed by introducing hydrogen gas, silane gas, and titanium chloride gas into a chamber, wherein the second connection layer is formed by introducing hydrogen gas and titanium chloride gas into the chamber, and wherein the third connection layer is formed by introducing hydrogen gas, titanium chloride gas, and ammonia gas into the chamber.

7. The method of claim 6, wherein a flow rate of the silane gas is gradually decreased and a flow rate of the titanium chloride gas is gradually increased when forming the first connection layer, and wherein a flow rate of the titanium chloride gas is gradually decreased and a flow rate of the ammonia gas is gradually increased when forming the third connection layer.

8. The method of claim 3, wherein the first connection layer comprises molybdenum silicide, wherein the second connection layer comprises molybdenum, and wherein the third connection layer comprises molybdenum nitride.

9. The method of claim 8, wherein the first connection layer is formed by introducing hydrogen gas, silane gas, and molybdenum chloride gas into a chamber, wherein the second connection layer is formed by introducing hydrogen gas and molybdenum chloride gas into the chamber, and wherein the third connection layer is formed by introducing hydrogen gas, molybdenum chloride gas, and ammonia gas into the chamber.

10. The method of claim 9, wherein a flow rate of the silane gas is gradually decreased and a flow rate of the molybdenum chloride gas is gradually increased when forming the first connection layer, and wherein a flow rate of the molybdenum chloride gas is gradually decreased and a flow rate of the ammonia gas is gradually increased when forming the third connection layer.

11. The method of claim 1, further comprising:
    primarily etching the buffer layer, resulting in a primarily etched buffer layer; and
    using the primarily etched buffer layer as a mask, primarily etching the active layer.

12. The method of claim 1, wherein the buffer layer is primarily etched using a chlorine-containing gas.

13. The method of claim 1, wherein etching the first the active layer is primarily etched using a fluorine-containing gas.

14. The method of claim 13, wherein the active layer comprises a semiconductor layer and an impurity layer, and wherein the active layer is secondarily etched on predefined portions of the impurity layer.

15. The method of claim 1, wherein
    the active layer includes a first material, and
    the buffer layer includes a second material that reacts with the first material in the active layer to form a compound.

16. The method of claim 1, wherein a content ratio changes continuously along a thickness of the buffer layer.

17. A method of manufacturing a thin-film transistor comprising:
    forming a gate electrode on a base substrate;
    forming a gate insulation layer on the substrate to cover the gate electrode;
    forming an active layer on the gate insulation layer to cover the gate electrode;
    forming a buffer layer on the active layer to suppress oxidation of the active layer, the buffer layer including at least a connection layer;
    forming the connection layer using at least a first gas in a deposition process;
    gradually decreasing a flow rate of the first gas as the deposition process progresses;
    primarily etching first predefined portions of the buffer layer and the active layer;
    forming a source electrode and a drain electrode on the primarily etched active layer, wherein the source electrode and the drain electrode are separated from each other by a predetermined distance; and secondarily etching second predefined portions of the buffer layer and the active layer, using as an etching mask at least one of the source electrode and the drain electrode.

18. The method of claim 17, wherein the first gas is a silane gas.

19. The method of claim 17, wherein the first gas is a titanium chloride gas.

20. The method of claim 17, wherein the first gas is a molybdenum chloride gas.

21. The method of claim 17, further comprising gradually increasing a flow rate of a titanium chloride gas when forming the connection layer.

22. The method of claim 17, further comprising gradually increasing a flow rate of an ammonia gas when forming the connection layer.

23. The method of claim 17, further comprising gradually increasing a flow rate of a molybdenum chloride gas when forming the connection layer.

* * * * *